United States Patent [19]

Migitaka et al.

[11] 4,219,731
[45] Aug. 26, 1980

[54] METHOD FOR DETECTING OBJECT PICTURE BY ELECTRON BEAM

[75] Inventors: Masatoshi Migitaka, Kokubunji; Koichiro Mizukami, Kodaira, both of Japan

[73] Assignee: VLSI Technology Research Association, Japan

[21] Appl. No.: 962,683

[22] Filed: Nov. 21, 1978

[30] Foreign Application Priority Data

Nov. 24, 1977 [JP] Japan .............................. 52-140048

[51] Int. Cl.² ........................................... G01N 23/00
[52] U.S. Cl. .................................... 250/310; 250/397
[58] Field of Search .............. 250/306, 309, 310, 311, 250/396 R, 397, 398, 492 A

[56] References Cited

U.S. PATENT DOCUMENTS

| | | |
|---|---|---|
| 3,329,813 | 7/1967 | Hashimoto ........................... 250/310 |
| 3,351,755 | 11/1967 | Hasler ................................. 250/310 |
| 3,381,132 | 4/1968 | Okano ................................. 250/310 |
| 3,549,999 | 12/1970 | Norton ................................ 250/310 |
| 3,597,607 | 8/1971 | Campbell et al. ................... 250/397 |

Primary Examiner—Bruce C. Anderson
Attorney, Agent, or Firm—Craig and Antonelli

[57] ABSTRACT

A method is disclosed in which an object picture such as an integrated circuit pattern is precisely and exactly detected at high speed by the use of an electron beam. At least two kinds of signals obtained by irradiating an object with an electron beam are detected and subjected to an adding/subtracting operation and a resulting signal is used to detect the object picture. Thus, a satisfactory S/N ratio can be obtained. The method is applicable to the inspection of a mask used for integrated circuits.

3 Claims, 6 Drawing Figures

METHOD FOR DETECTING OBJECT PICTURE BY ELECTRON BEAM

BACKGROUND OF THE INVENTION

This invention relates to a method for detecting an object picture by an electron beam, and more particularly to such a method for detecting a pattern precisely and exactly at higher speed in, for example, the inspection of a mask use for integrated circuits (IC's).

To detect an object picture, the surface of an object is scanned by a well focussed electron beam and a signal varying in accordance with the condition of the object surface such as the presence or absence of a certain pattern is to be used. As shown in FIG. 1, when an object 2 is irradiated with an electron beam 1, there are generated signals such as reflected electrons 3, secondary electrons 4, absorption current 5 and X-rays 6, as is well known. In FIG. 1, arrows indicate the directions in which the electron beams and the electromagnetic waves travel.

The conventional technique using one of the above signals to investigate the structures of various objects is widely used in the field of scanning type electron microscopes. However, since some objects can only produce very low contrast, the conventional technique has frequently failed to generate a signal having a desired change in amplitude. Further, an electron beam having a large current density cannot be used since the destruction of the object surface by the electron beam must be prevented. Consequently, a signal having a large S/N (signal-to-noise) ratio cannot be obtained or a sufficient signal cannot be derived from each of the picture elements scanned at high speed. For example, in the case when a metalization pattern formed on a semiconductor substrate is detected by using reflecting electrons, secondary electrons or absorption current, it was revealed that a satisfactory S/N ratio could not be attained, which results in an adverse effect which restricts the speed in detecting patterns.

SUMMARY OF THE INVENTION

An object of this invention is to provide a method capable of detecting an object picture precisely and exactly at higher speed.

To that end, in the method according to this invention, at least two kinds of signals generated by irradiating an object with an electron beam are detected and subjected to an adding and/or subtracting operation after a suitable pre-treatment or without any pre-treatment. The resulting signal is used to detect the object picture.

DETAILED DESCRIPTION OF THE PREFERRED EMBODIMENTS

Figure 2A:
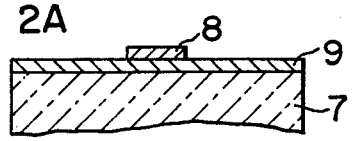
FIGS. 2A and 2B show a pattern of chromium formed on a Nesa (trade name) glass and the intensities of some signals obtained from the pattern, respectively
Figure 2B:
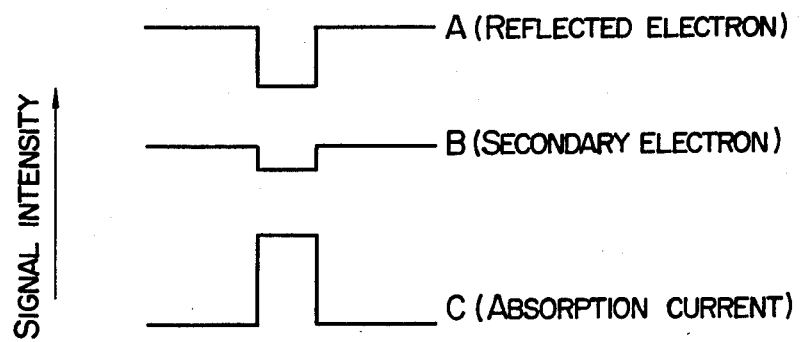

This invention is based on the following new fact revealed by the inventors' experiments. The inventors have found out that a reflected-electron signal, a secondary-electron signal and an absorption current signal which are to be separately treated in the conventional method, are closely related to each other. For example, in the case where a pattern of chromium 8 is formed on a Nesa film 9 of a glass substrate 7 as shown in FIG. 2A, a signal A relating to the reflected electrons is in phase with a signal B relating to the secondary electrons but opposite in phase to a signal C relating to the absorbed electrons, as shown in FIG. 2B. A similar result was also obtained in the case of a gold pattern formed on a silicon substrate.

Figure 1:
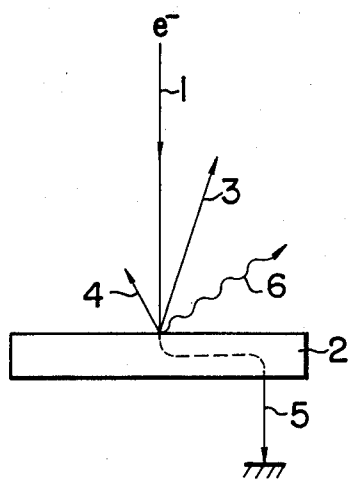
FIG. 1 illustrates various signals generated by irradiating an object with an electron beam.
Figure 3:
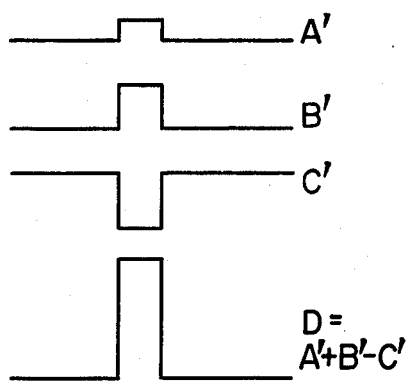
FIG. 3 illustrates the principle of this invention.

From FIG. 3 illustrating the principle of this invention, it is apparent that if signals $A'$ and $B'$ of the same phase are added together and if a signal $C'$ opposite in phase to the signal $A'$ and $B'$ is substracted from the resultant signal $A'+B'$, a signal D having a S/N ratio larger than the S/N ratio for each of the signals $A'$, $B'$ and $C'$ can be derived.

Now, this invention will be described in detail by way of embodiments.

Figure 4:
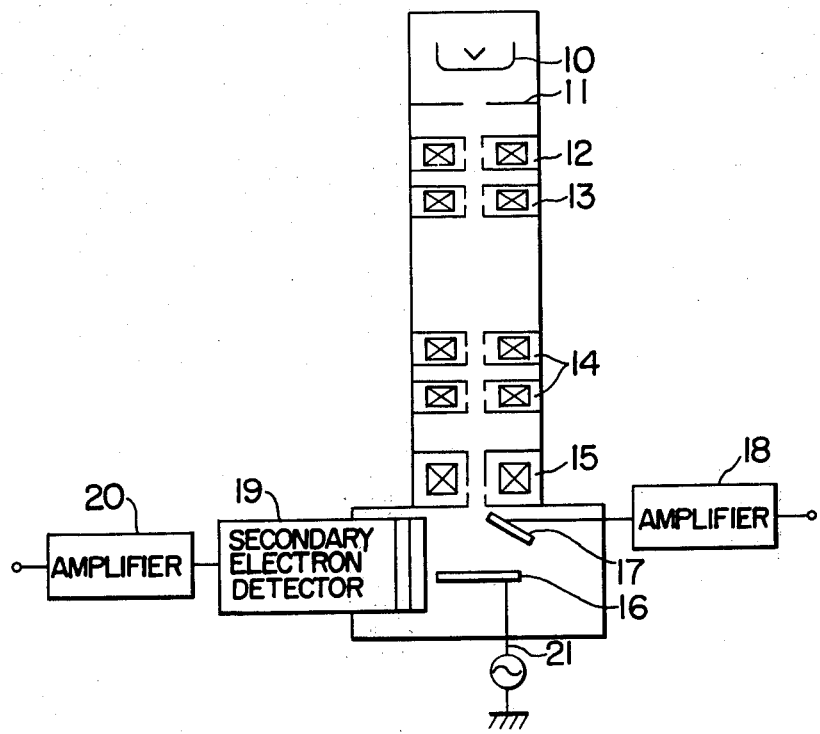
FIG. 4 schematically shows an apparatus used for embodying this invention.

FIG. 4 shows a schematic structure of an apparatus used in an embodiment of this invention. An electron beam emitted from an electron gun 10 is well focussed by first and second condenser lenses 12 and 13 and then deflected by a deflecting coil 14 to scan the surface of a sample 16. Reference numeral 11 indicates an anode and numeral 15 indicates an objective lens. With this apparatus, reflected electrons and secondary electrons from the sample 16 are separately processed. Namely, the reflected electrons are detected by a reflected-electron detector 17 such as a semiconductor detector whose output is amplified by an amplifier 18 while the secondary electrons are detected by a secondary-electron detector 19 such as a combination of a scintillator and a photomultiplier whose output is amplified by an amplifier 20. As the sample 16 is used a glass plate with a conductive film of indium oxide deposited on its surface and with a pattern of chromium formed on the indium oxide film. It has been observed that a signal obtained by adding a signal relating to the reflected electrons and a signal relating to the secondary electrons together has a S/N ratio equal to 1.4 times that for each of the respective original signals. Therefore, the probability of an error being caused in detecting a pattern could be reduced to $1/10^6$ and the speed of detection (or the quantity of information picked up for a unit time) could be doubled.

Figure 5:
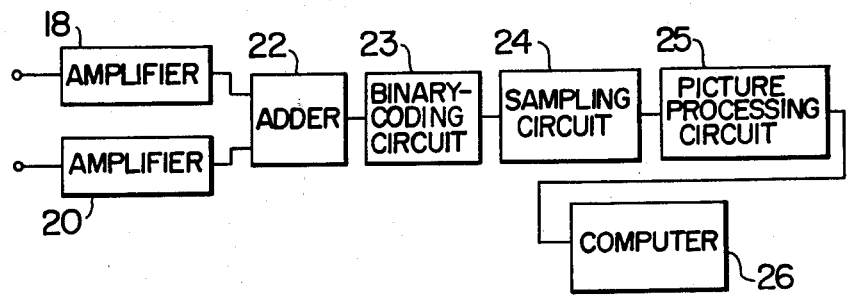
FIG. 5 shows in block diagram an electronic circuit for pattern detection.

The detected signals are supplied to an electronic circuit shown in FIG. 5 to detect the pattern. As shown in the FIGURE, the separately detected and amplified signals are added together in an adder 22. The output of the adder 22 is converted into a digital signal through a well-known binary coding circuit 23 and a sampling circuit 24. In accordance with the instruction from an electronic computer 26, the output of the sampling circuit 24 is supplied to a well-known picture processing circuit 25, which recognizes the pattern on the sample 16.

Further, an experiment to improve a S/N ratio was made by using an absorption current 21 shown in FIG. 4 besides the above-mentioned two kinds of signals. In this experiment, the absorption current 21 is first amplified and then supplied to the adder after having been phaseinverted. In this case, through the response speed of the current through the sample is relatively low, the S/N ratio is increased by a factor of 1.2. The method embodied in this experiment proves to be useful in the case where a small signal is to be treated.

Similar experiments were further performed using as a sample a silicon substrate with a pattern of thin gold film. In this case, the S/N ratio obtained by the case where a signal relating to reflected electrons and a signal relating to secondary electrons are separately detected and then added together, could be increased by a factor of 1.16 in comparison with that obtained by the case where only the signal relating to reflecting electrons is detected. Thus, the probability of an error being caused in detecting a pattern could be reduced to $1/10^4$ and the speed of detection could be increased by a factor of 1.5.

Though the principle and some embodiments have been described, this invention is never limited to the specified embodiments and numerous variations or modifications are possible without departing from the scope of this invention.

We claim:

1. A method for detecting a mask pattern by an electron beam, comprising:
   a first step of irradiating with an electron beam a mask having a pattern formed on a surface thereof;
   a second step of separately detecting a signal relating to reflected electrons from said mask and a signal relating to secondary electrons from said mask;
   a third step of adding the reflected-electron signal and the secondary-electron signal; and
   a fourth step of binary-coding and sampling a signal resulting from said third step into digitalized information and subjecting said digitalized information to picture processing to detect the pattern of said mask.

2. A method for detecting a mask pattern by an electron beam, comprising:
   a first step of irradiating with an electron beam a mask having a pattern formed on a surface thereof;
   a second step of separately detecting a signal relating to reflected electrons from said mask, a signal relating to secondary electrons from said mask and a signal relating to absorption current through said mask;
   a third step of adding the reflected-electron signal, the secondary-electron signal and a phase-inverted version of the absorption current signal;
   a fourth step of binary-coding and sampling a signal resulting from said third step into digital information and subjecting said digital information to picture processing to detect the pattern of said mask.

3. A method for detecting an object picture by an electron beam, comprising:
   a first step or irradiating an object with an electron beam;
   a second step of separately detecting a signal relating to reflected electrons from said object, a signal relating to secondary electrons from said object and a signal relating to absorption current through said object;
   a third step of adding said reflected-electron signal, said secondary-electron signal and a phase inverted version of said absorption current signal; and
   a fourth step of converting a signal resulting from said third step into digital information to detect an object picture.

* * * * *